(12) United States Patent
Floro et al.

(10) Patent No.: US 6,912,678 B1
(45) Date of Patent: Jun. 28, 2005

(54) SYSTEM FOR IDENTIFYING VALID CONNECTIONS BETWEEN ELECTRICAL SYSTEM COMPONENTS AND RESPONDING TO INVALID CONNECTIONS

(75) Inventors: William E. Floro, Willoughby, OH (US); Frank J. Priore, Willoughby Hills, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 702 days.

(21) Appl. No.: 09/699,392

(22) Filed: Oct. 31, 2000

(51) Int. Cl.[7] ............................................. G01R 31/28
(52) U.S. Cl. ...................................... 714/724; 324/500
(58) Field of Search .................................. 714/724, 733, 714/734, 736, 721, 22, 30, 36, 48; 324/500, 508, 522

(56) References Cited

U.S. PATENT DOCUMENTS 6,557,106 B1 * 4/2003 Yuzawa et al. ............. 713/300
6,640,323 B2 * 10/2003 Akram ....................... 714/724

* cited by examiner

Primary Examiner—Phung My Chung
(74) Attorney, Agent, or Firm—Amin & Turocy LLP; R. Scott Speroff

(57) ABSTRACT

A method and circuitry for ensuring proper connections of a multi-wired cable bridging two electrical components in a programmable logic controller (PLC) system. The method involves: generating a pre-specified voltage level when the cable is properly connected, testing for the existence of this pre-specified voltage level, and generating an error signal if the pre-specified voltage level is not detected. The error signal generated by a component causes the component to electronically switch off its data connection via the multi-wired cable with the other component, and may cause the component to reset itself.

27 Claims, 10 Drawing Sheets

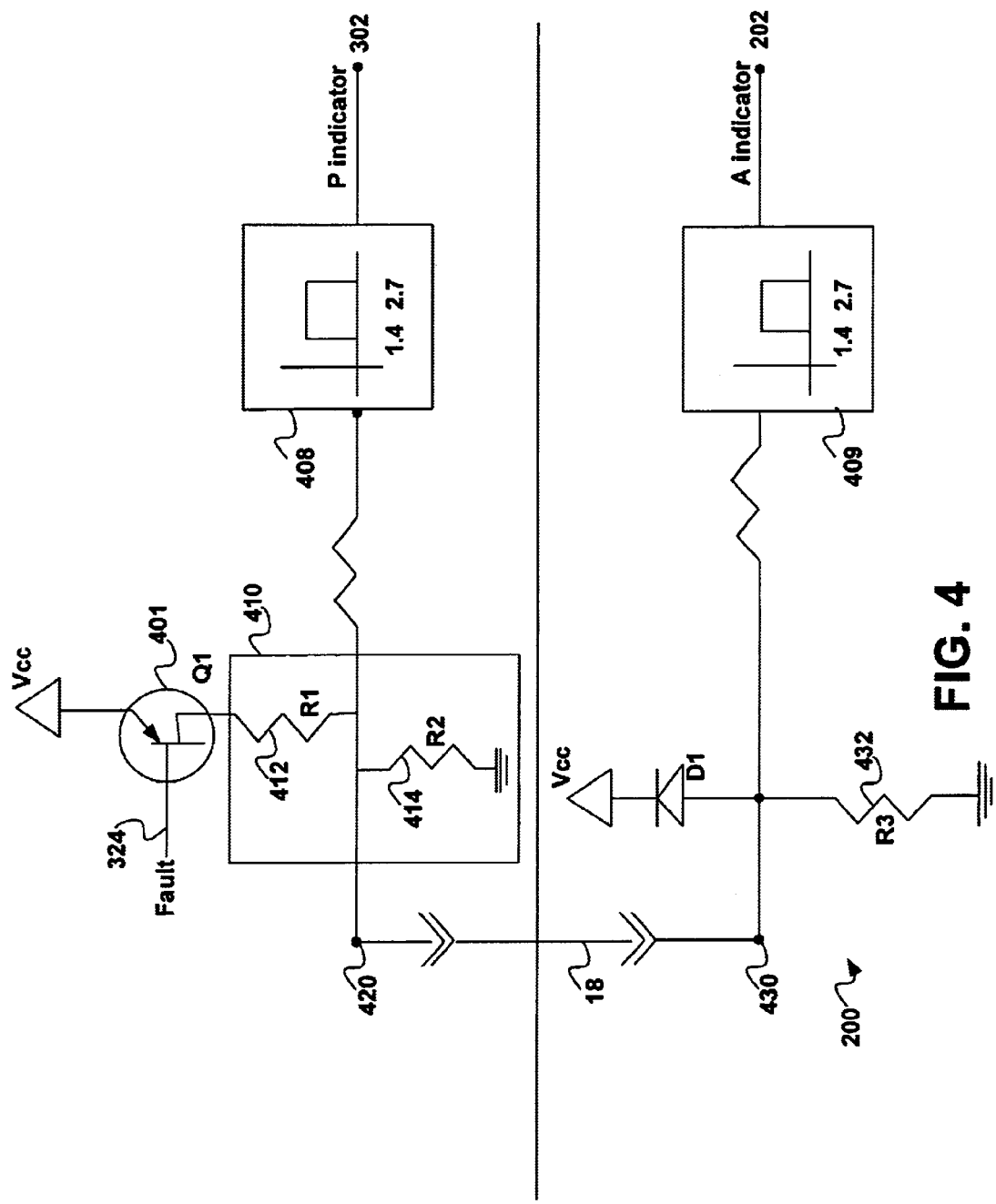

SYSTEM FOR IDENTIFYING VALID CONNECTIONS BETWEEN ELECTRICAL SYSTEM COMPONENTS AND RESPONDING TO INVALID CONNECTIONS

FIELD OF INVENTION

The invention generally relates to a system for identifying valid connections between components of an electrical system and for preventing damage which may be caused as a result of invalid connections. More particularly, the invention relates to a method and system for detecting a valid connection between a processor and an adapter in a programmable logic controller (PLC) system and for protecting the components thereof in the event of an invalid connection.

BACKGROUND OF THE INVENTION

Programmable logic controllers are used to control a wide variety of industrial processes and machines. Typically, a PLC comprises a processing module (the "processor") which is connected to one or more input/output (I/O) modules via a system bus. The I/O modules provide input and output ports or lines which are directly connected to external machinery or sensors. In a typical PLC system the processor continuously polls the input bits of the 110 modules, processes the input data and sets output bits of the I/O modules accordingly.

The system bus which allows the processor and the I/O modules to communicate with one another consists of a number of lines or electrical paths. These lines carry data signals between the processor and the I/O modules, and enable the processor to select a particular I/o module when the processor needs to establish communications with the I/O module. The bus may also provide power, reset and ground lines to the I/O modules.

One example of a PLC system is the FLEXLOGIC™ system marketed by Rockwell Automation of Milwaukee, Wis. The system bus in this PLC system includes:

- two lines (DIN and DOUT) for the bidirectional transmission of serial data;
- two lines (CLK HIGH and CLK LOW) for carrying a differential clock signal generated by the processor;
- eight (8) I/O module select signals;
- one line (RESET) which functions as a system reset signal;
- one line (PWR) for supplying power generated by a power supply on the processor to various I/O modules; and
- one line (GND) which connects the processor and the I/O modules to a common ground point.

In a typical PLC system, including the FLEXLOGIC™ system mentioned above, each I/O module includes two connector ports (hereinafter "bus" ports) that allow the module to plug into adjacent preceding and receding I/O modules in daisy chain fashion. The two bus ports in each I/O module are internally connected in order to provide a contiguous system bus across the chain of I/O modules. The processor also includes a bus port in order to allow the first I/O module in the chain (which can be any I/O module since the bus ports are typically identical aside from their polarity) to directly plug into the processor.

Mechanically, the processor and the I/O modules may be mounted onto a rail which in turn may be mounted onto a wall or some other such support structure. The chain of I/O modules which directly plugs into the processor may be referred to as the "local rail". The local rail may be physically split into two (or potentially more) units or parts through the use of a multi-wired cable. The cable essentially forms an extension of the system bus in order to interconnect the bus ports of spaced apart, but logically adjacent, I/O modules. This allows the system components to be mounted onto two physical rails and hence occupy a smaller horizontal footprint, thereby providing installation flexibility.

The maximum number of I/O modules in the local rail is typically limited due to various constraints such as the number of I/O module select lines provided by the system bus and electrical noise. So, in the event the processor has the capacity to handle additional I/O modules, it may be desirable to connect another chain of I/O modules to the processor in addition to the local rail. This second chain of I/O may be referred to as the "remote rail". In the FLEXLOGIC™ system, an adapter is required to connect the processor to the remote rail as discussed in greater detail below. This adapter has two bus ports. The first I/O module of the remote rail plugs into one adapter bus port. The second adapter bus port is used to connect the adapter to the processor through another multi-wired cable. Other I/O modules in the remote rail may be plugged into adjacent I/O modules through the bus ports on each I/O module. In addition, the remote rail may be split into two (or potentially more) units or parts through a multi-wired cable.

In the FLEXLOGIC™ system, the processor includes a power supply which provides power to the I/O modules on the local rail. This power supply generally does not have a sufficient power rating to drive more I/O modules than the maximum number permitted on the local rail. While it is possible to increase the output of the power supply on the processor, the extra cost would be borne by all customers, even those which have no need for a remote rail in their applications. For this reason the adapter has its own power supply which provides power to the I/O modules on the remote rail.

It should be noted from the foregoing that because the bus ports are identical, it is possible to connect cables between any two bus ports of a processor, an adapter, and I/O modules. As both a processor and an adapter have their own power supply, connecting these electronic components incorrectly may introduce inappropriate voltages or currents to the processor, the adapter, or the I/O modules. This is particularly problematic because the I/O modules are connected to a variety of external devices such as sensors or external machinery. Inappropriate connections may introduce false signals to the I/O modules and cause the sensors or machinery to operate erratically which could pose serious hazards or dangerous conditions.

In particular, a problem exists when a powered-up processor is connected to an unpowered adapter. In this case, the adapter will pass clock signals from the processor through to the I/O modules. Referring to FIG. 8, each I/O module is controlled by an ASIC 802 which has input clamp diodes 804 connected from an input signal (e.g., clock signals) to the positive power line 806 and ground line 808, as shown. The purpose of these clamp diodes is to provide input protection so that the input signal is limited to a predetermined voltage range. However, when no power voltage is applied to the positive power line of an I/O module, the clock signal may "leak" to the positive power line through these clamp diodes. This may in effect "bring up" the I/O module because it will appear that power has been supplied over the power lines. Consequently, the I/O module may operate on or produce spurious and incoherent data which may cause equipment connected to the I/O module to operate erratically. In addition, the clamp diodes may be damaged because they are not rated for relatively large power line currents that may arise when the clock signals "bring up" the I/O modules. A similar problem arises when an unpowered processor is connected to a powered-up adapter.

In addition, as PLC systems typically use a positive voltage to represent an unasserted RESET line, a similar problem may arise when a powered-up processor or any I/O on the local rail thereof is connected to a second dead or unpowered PLC system. In this case, the RESET signal on the local rail which is driven by the processor may "leak" through the clamp diodes of the unpowered I/O modules to the positive power line thereof and may "bring up" I/o modules of the second PLC system. Here too, the input clamp diodes of these I/O modules may be damaged due to excessive current flow therethrough. A similar problem arises when a second, powered, PLC system is connected to the processor when it is in an unpowered state.

Usually, different cables and connection ports are used for different connections in order to prevent such miswirings from occurring. A cable can only be physically plugged into a mating connection port. Wrong connections are thus eliminated because they would entail plugging a cable into a connection port that does not physically match. This method requires the use of differently configured connection ports and cables, thus increasing manufacturing, inventory- and maintenance costs.

To reduce these costs, it is desirable to use the same type of cable for the different types of connections in a PLC system. Using the same cable for different connections reduces manufacturing, inventory and maintenance costs. However, it also introduces the possibility of miswirings such as connecting two processors or two adapters together, or connecting a processor or an adapter to another PLC system that is powered down. In addition, as mentioned above, a problem exists when connecting a processor to an unpowered adapter, or when connecting an adapter to an unpowered processor. It is desirable to minimize any damage that may occur as a result of such invalid connections.

SUMMARY OF THE INVENTION

It is therefore desirable to have a method of validating cable connections to ensure the appropriateness thereof, thus making it possible to reap the benefits associated with using the same cable for all connections without incurring many of the risks associated with improper or undesired connections (i.e., invalid connections). Additionally, because invalid connections may cause physical damage to hardware, it is also desirable to have protection circuitry to prevent such physical damage.

One aspect of the invention provides a method and circuitry for validating the connection of a multi-wired cable bridging first and second electrical components. According to the method, a pre-specified voltage level is generated when the cable is properly connected between the first and second components and at least the first component is powered up. Each of the components tests for the presence of the pre-specified voltage level and if any component does not detect the pre-specified voltage level the component asserts an error signal. The pre-specified voltage level may be generated by providing a voltage divider in the first component and a circuit element, such as a resistor, in the second component. The circuit element, when connected to the first component via a wire in the cable, modifies the output of the voltage divider to yield the pre-specified voltage level. The testing for the pre-specified voltage level may be implemented using a window comparator for testing whether the output of the voltage divider falls within a pre-specified voltage range. When applied to a PLC system such as the FLEXLOGIC™ system described above, the second component may be a processing module and the first component may be an adapter.

The illustrative embodiment provides means for short circuiting the circuit element such as the resistor in the second component when it is powered down. As a result the pre-specified voltage level is not produced thereby enabling the first component to determine whether the second component is powered up.

Alternatively or additionally, the first component can determine whether the second component is powered up by detecting the state of a normally high reset (or other such) signal which is intended to be received from the second component via the cable. The first component asserts its error signal if it does not detect the reset signal to be in a non-zero, unasserted state.

If the error signal on either component is asserted, in the illustrative embodiment the component blocks the transmission of bus signals via the multi-wired cable or with other components such as I/O modules.

Another aspect of the invention provides circuitry for protecting a first electrical system when connected via a cable or bus to a second electrical system. The cable or bus provides a current-carrying signal, such as a clock signal, to the first electrical system and includes a reset signal which is monitored by the second electrical system. According to this aspect of the invention an energy storage component such as a capacitor is connected to the current-carrying signal of the cable or bus. A first switch is electrically connected between a node of the capacitor and a ground point. The circuitry keeps the first switch on or closed when the first electrical system is powered-up. The first switch is off or open when the first electrical system is powered down. A second switch is electrically connected between the reset signal of the cable or bus and the ground point. The second switch is activated or closed by the energy accumulated by the capacitor when the first switch is off or open. This causes the second electrical system to enter a reset state. In preferred embodiments the reset signal is logically high when unasserted and the current-carrying signal may be a clock signal.

BRIEF DESCRIPTION OF THE DRAWINGS

The foregoing and other aspects of the invention will become more apparent from the following description of a specific embodiment thereof and the accompanying drawings which illustrate, by way of example only, the principles of the invention. In the drawings, Where like elements feature like reference numerals (which may bear unique alphabetical suffixes in order to identify specific instances of like elements):

FIG. 4 is a circuit diagram showing the cable validation circuitry, a portion of which is located on the adapter and a portion of which is located on the processor, in greater detail;

DETAILED DESCRIPTION OF PREFERRED EMBODIMENTS

Figure 1:
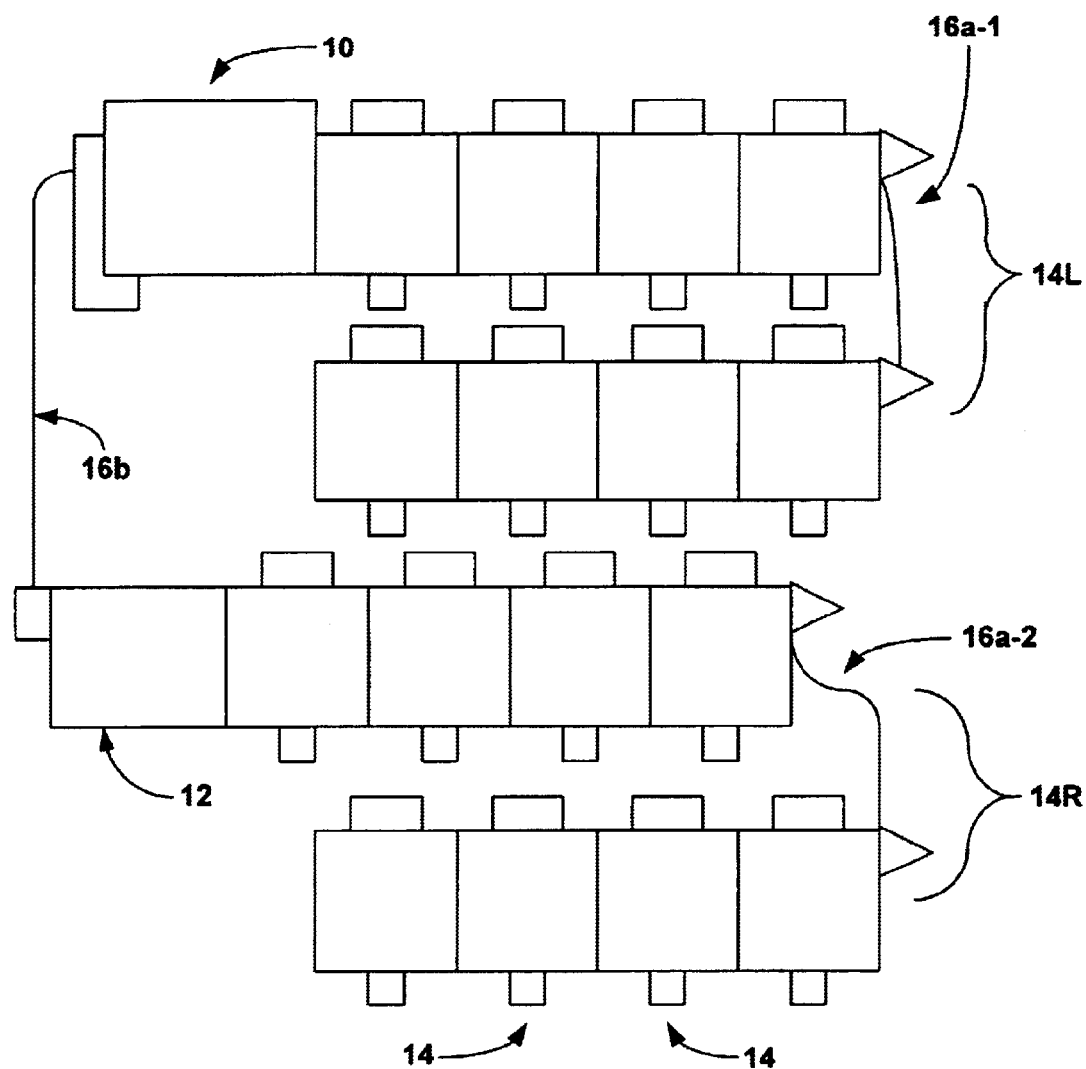
FIG. 1 shows a PLC system comprising a processor, an adapter and I/O modules which are connected together through multi-wired cables.

Referring to FIG. 1 an example of a modular PLC system is shown having a processor 10, an adapter 12 and a plurality of I/O modules 14. The processor 10 and I/O modules 14 are mounted on a rail (not clearly visible in FIG. 1) which may be mounted onto a wall or some other such support structure. The I/0 modules grouped under reference numeral 14L form the "local rail". As shown, the local rail is divided into two units or parts (i.e., two physical rails) via a multi-wired cable 16a. The I/O modules grouped under reference numeral 14R form the "remote rail". These I/O modules plug into the adapter 12 which is connected to the processor 10 via another multi-wired cable 16b (that is identical in structure and configuration to cable 16a). As illustrated, the remote rail is also split into two units or parts via a second multi-wired cable 16a.

Each I/O module 14 includes two bus ports (not clearly visible in FIG. 1) that allow the module to plug into adjacent preceding and receding I/O modules in daisy chain fashion. As discussed earlier, these ports enable a system bus to be formed between the processor 10 and each I/O module 14. Alternatively, as shown, the multi-wired cable 16a may be used to interconnect bus ports on adjacent I/O modules. The cable 16a thus enables the system bus to be contiguous over the local rail or remote rail and enables the system to be mounted within a more confined horizontal space. This adds a certain degree of flexibility in mounting the PLC system to a wall or some other such support structure.

The invention allows the same type of cable to be used to connect the processor to the adapter or to split the local rail or remote rail into two or more units. Since the I/O ports on the processor, adapter and 110 modules are identical, it is also possible to accidentally connect two processors together, two adapters together, or any component of a first PLC system to a component in a second PLC system. In order to minimize damage caused by invalid connections, validation and protection circuitry is distributed over the processor 10 and adapter 12 to ensure that cable 16b is properly connected between these two components and that both are powered up and functioning normally.

Figure 2:
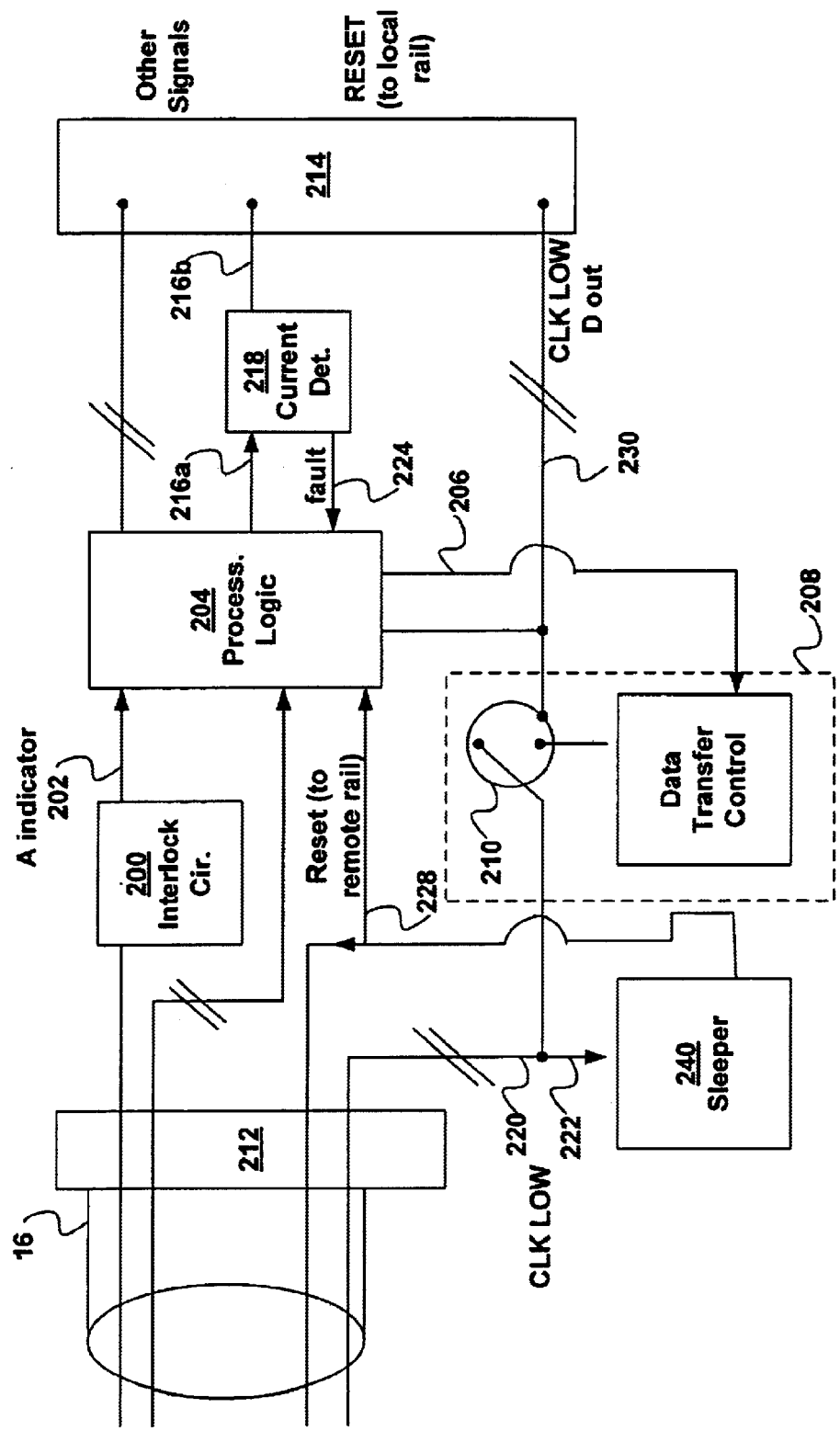
FIG. 2 is a schematic block diagram of validation and protection circuitry located on the processor.

Referring to FIG. 2, the validation and protection circuitry on the processor 10 comprises an interlock circuit 200 which detects whether the processor is validly connected to a powered adapter 12. Generally speaking, this is accomplished by generating a pre-specified voltage level when the cable 16b is properly connected and both components are powered up. The interlock circuit 200 tests for the existence of the pre-specified voltage level and asserts a signal, A-indicator 202, if the pre-specified voltage level is not detected.

The A-indicator signal 202 is applied to processing logic 204 which consequently asserts an error signal 206 that is fed into a data transfer control circuit 208. When the signal 206 is asserted the data transfer control circuit 208 turns electronic switches 210 (only one is shown) off. This blocks the transmission of various bus signals between the processing logic 204 and a bus port 212 (i.e., between lines 220 to lines 230). The switches 210 remain on when the error signal 206 is unasserted in order to allow data transfer. In this manner the interlock circuit 200 ensures that the processor 10 is validly connected to the adapter 12 via cable 16b properly connected to the bus port 212 since this is the only intended use for the port 212.

However, as mentioned previously, when the processor 10 is powered up it may be accidentally connected to a second, unpowered PLC-system through another bus port 214 which is intended only for connecting the processor to the first I/O module of the local rail. Alternatively, one of the I/O modules of the local rail may be accidentally connected to the second, unpowered, PLC system. In either case, a relatively large amount of current may be drawn from a reset (to local rail) line 216b. For this reason a current detector 218 senses the presence of excess current drawn on the reset (to local rail) line 216b and generates a fault signal 224 when an over-current condition is detected. When asserted, the fault signal 224 interrupts the processing logic 204. In response, the processing logic 204 preferably asserts the reset (to local rail) line 216a, b in order to place the local rail in the reset state and may also assert a reset (to remote rail) line 228 in order to place the remote rail in a reset state. The processing logic 204 may also assert the error signal 206 in order to block the transmission of certain signals to the adapter 12.

A situation may also arise where a second, powered-up, PLC system is connected via cable 16b to the processor 10 when it is in an unpowered state. To prevent potential damage that may occur in this case the processor 10 includes a "sleeper" circuit 240 which, as explained in greater detail below, uses the energy from the second PLC system to bring down or ground the reset (to remote rail) line 228 carried by cable 16b, thereby shutting down the second system. The sleeper circuit is not active and has no effect on the reset (to remote rail) line 228 when the processor 10 is in a powered-up state.

Figure 3:
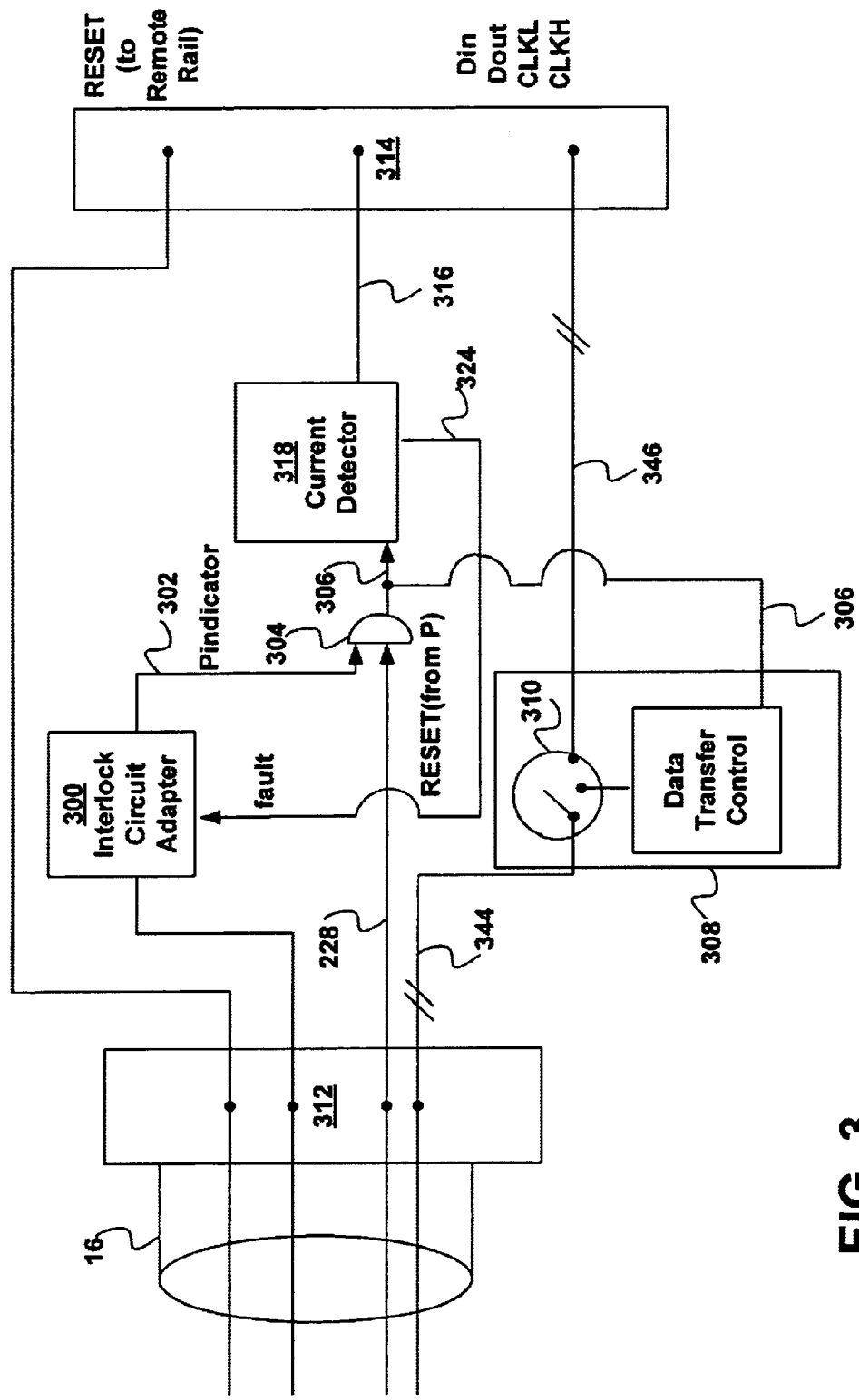
FIG. 3 is a schematic block diagram of validation and protection circuitry located on the adapter.

Referring to FIG. 3, the validation and protection circuitry on the adapter 12 comprises an interlock circuit 300 which tests for the pre-specified voltage level that should be present when the cable 16b is properly connected between the processor 10 and the adapter 12. The interlock circuit 300 asserts a signal, P-indicator 302, if the pre-specified voltage is not detected. The P-indicator signal 302 is applied to an AND gate 304 which has as its other input the reset signal 228 that is generated by the processor 10 and carried by cable 16b. As explained in greater detail below, the output 306 of the AND gate 304 is an error signal which indicates whether the adapter is properly connected to a powered-up processor. This error signal 306 is applied to a data transfer control circuit 308. When the error signal 306 is asserted the data transfer control circuit 308 turns off electronic switches 310 (only one is shown) in order to block the transmission of certain bus signals from lines 344 to lines 346. When the error signal 306 is unasserted, the switches 310 remain on allowing signal transmission. In this manner the interlock circuit 300 in conjunction with the AND gate 304 ensure that the adapter 10 is only connected via bus port 312 to a powered-up processor 10.

However, the adapter 12 can be accidentally connected to a second, unpowered, PLC system through bus port 314 which is intended only for connecting the adapter 12 to the first I/O module of the remote rail. Alternatively, one of the I/O modules of the remote rail may be accidentally connected to the second, unpowered PLC system. In either case, a relatively large amount of current may be drawn from a reset (to remote rail) line 316. For this reason, a current detector 318 senses the presence of excess current on the reset (to remote rail) line 316 and generates a fault signal 324 when an over-current condition is present. The fault signal 324 causes the interlock circuit 300 to assert the P-indicator signal 302, which in turn causes the data transfer circuit 308 to turn off switches 310 and inhibit the transmission of problematic bus signals.

The manner in which the interlock circuits 200 and 300 co-operate to generate the pre-specified voltage is explained in greater detail with reference to FIG. 4. Note that the circuitry shown above the broken line in FIG. 4 resides on the adapter 12, and the circuitry shown below the broken line resides on the processor 10. These two portions of the validation and protection circuitry are electrically connected through an interlock line 18 in the multi-wired cable 16b, which connects a terminal 420 on the adapter with a terminal 430 on the processor.

The interlock line 18 in cable 16b is the same line which, when the cable is used to split a rail, carries power to the I/O modules. When the cable is used to connect the processor 10 to the adapter 12, the PWR line for supplying positive power voltage to the I/O modules is remapped into the interlock line 18. This is possible because the adapter has its own power supply making the power supply line between the processor and adapter redundant.

On the adapter side, a voltage divider 410 is formed by resistors R1 (412) and R2 (414). The positive power voltage Vcc is applied to the voltage divider through a transistor Q1 (401), the function of which is described in greater detail below. Resistor R2 has a fairly high resistance compared to resistor R1 such that in the absence of the electrical connection between terminal 420 and terminal 430 the output of the voltage divider 410 is very close to Vcc. The common node or output of the voltage divider 410 is connected to terminal 420. When cable 16b is properly connected, the interlock line 18 connecting terminals 420 and 430 causes a resistor R3 (432) on the processor side to be connected in parallel with resistor R2. Thus, the output of the voltage divider 410 can be lowered to a pre-specified voltage level by choosing a resistor R3 with a resistance much smaller than that of resistor R2. In the illustrated embodiment, that pre-specified voltage is approximately two volts (plus or minus about 0.5 volts) and the positive power voltage Vcc is approximately 5 volts.

The terminals 420 and 430 (and hence the output of the voltage divider 410) are respectively connected to a window comparator 408 on the adapter and a window comparator 409 on the processor. A window comparator tests whether its voltage input is within a pre-specified voltage range or window. In the illustrated embodiment, the pre-specified voltage window has a range of about 1.4 to 2.7 volts. If the voltage input is within that range, it is assumed that a valid cable connection has been made, and neither window comparator 408 or 409 will assert the indicator signals 30.2 or 202.

When the adapter and processor are not connected via cable 16b the output at the voltage divider 410 is determined solely by the resistances of resistors R1 and R2. As mentioned earlier, the voltage output of the voltage divider 410 is very close to Vcc in such a situation. Therefore, the window comparator 408 sees a voltage input much higher than 2.7 volts, which is outside the pre-specified voltage window of 1.4 to 2.7 volts. The window comparator 408 on the adapter 12 consequently asserts the P-indicator signal 302 to indicate an invalid connection with the processor. Similarly, without an electrical connection between terminal 430 and terminal 420, there is substantially no voltage at processor terminal 430 because it only has an unconnected passive resistor R3. As a result, the window comparator 409 on, the processor sees a voltage input far less than 1.4 volts, which is also outside the voltage window of 1.4 to 2.7 volts. The window comparator 409 on the processor consequently asserts the A-indicator signal 202 to indicate an invalid connection with the adapter. In this manner, when either window comparator sees an out-of-range input voltage, the other window comparator is also aware of the error condition.

Note that the adapter does not always have to be connected to the processor in order for the latter to operate. This is because the processing logic 204 on the processor polls the, A-indicator line 202. When line 202 is asserted, the processing logic establishes a state which presumes that the adapter is not connected and prevents the transmission of problematic bus signals to the bus port 212. Likewise, the processing logic 204 can also determine when an adapter has just been connected to the processor.

Figure 5A:
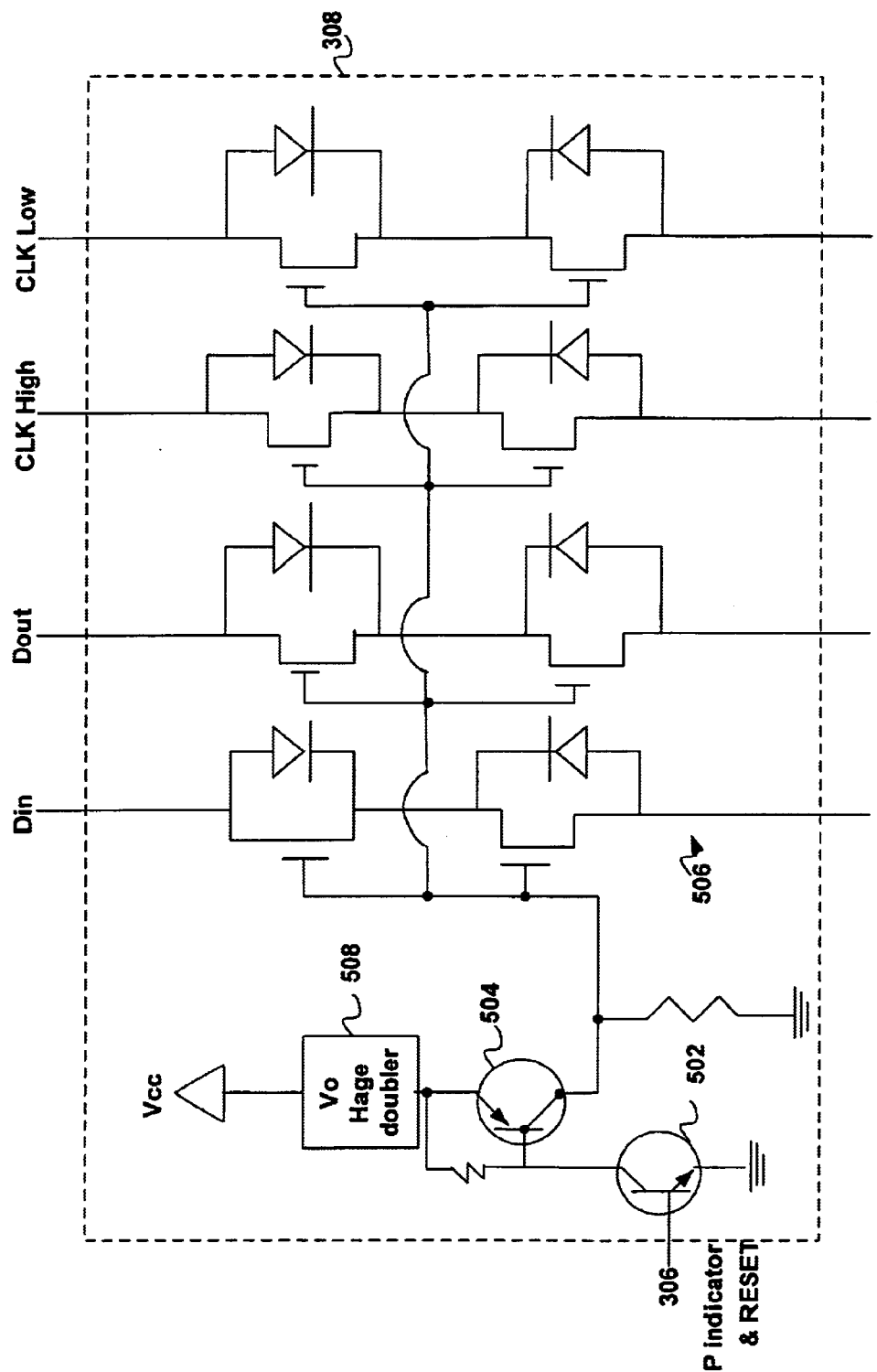
FIGS. 5A & 5B are circuit diagrams showing various portions of the protection circuitry residing on the adapter in greater detail.

FIG. 5A shows the data transfer control circuit 308 of the adapter 12 in greater detail. An N-P-N transistor 502 is connected in series with a P-N-P transistor 504. The emitter of transistor 504 is connected to a voltage doubler 508, which in turn is connected to the positive power line Vcc. The gate terminals of four field effect transistor (FET) pairs 506 are connected to the collector of transistor 504. (Note that N-channel FETs are used in series with their internal parasitic diodes pointing in opposite directions as shown in FIG. 5A so that no current flows through the diodes when the FETs are off). Therefore, transistor 504 controls the gate voltages of FETs 506. The FET pairs 506 function as electrical switches in the electrical paths of data signals. The FET pairs are switched electronically by transistor 504 to control the blocking of four signals transmitted through the multi-wired cable 16b, namely DIN, DOUT, CLK HIGH, and CLK LOW.

In the absence of any connection error, the P-indicator signal 302 is not asserted (i.e., is high). As will be described in greater detail below, when the processor is powered-up and in its normal operating state, the error signal 306, which is connected to transistor 502, is also not asserted (i.e., is high). Transistor 502 then has bias current applied to it. This switches on transistor 502, which consequently switches on transistor 504. Because transistor 504 is switched on, gate voltage is applied to the FET isolation transistors 506. As is well known to those skilled in the art, this puts the N-channel FET isolation transistors in their "ON" state, allowing all four bus signals to pass through. If the window comparator 408 asserts the P-indicator error signal 302 (i.e., it goes low), the signal 306 is also asserted (i.e., goes low). This turns transistor 502 off which consequently turns transistor 504 off thereby removing gate voltage from all FET isolation transistors 506. This turns off these FET isolation transistors and blocks the transmission of the DIN, DOUT, CLK HIGH, and CLK LOW signals through the adapter 12 to the remote rail.

Figure 6A:
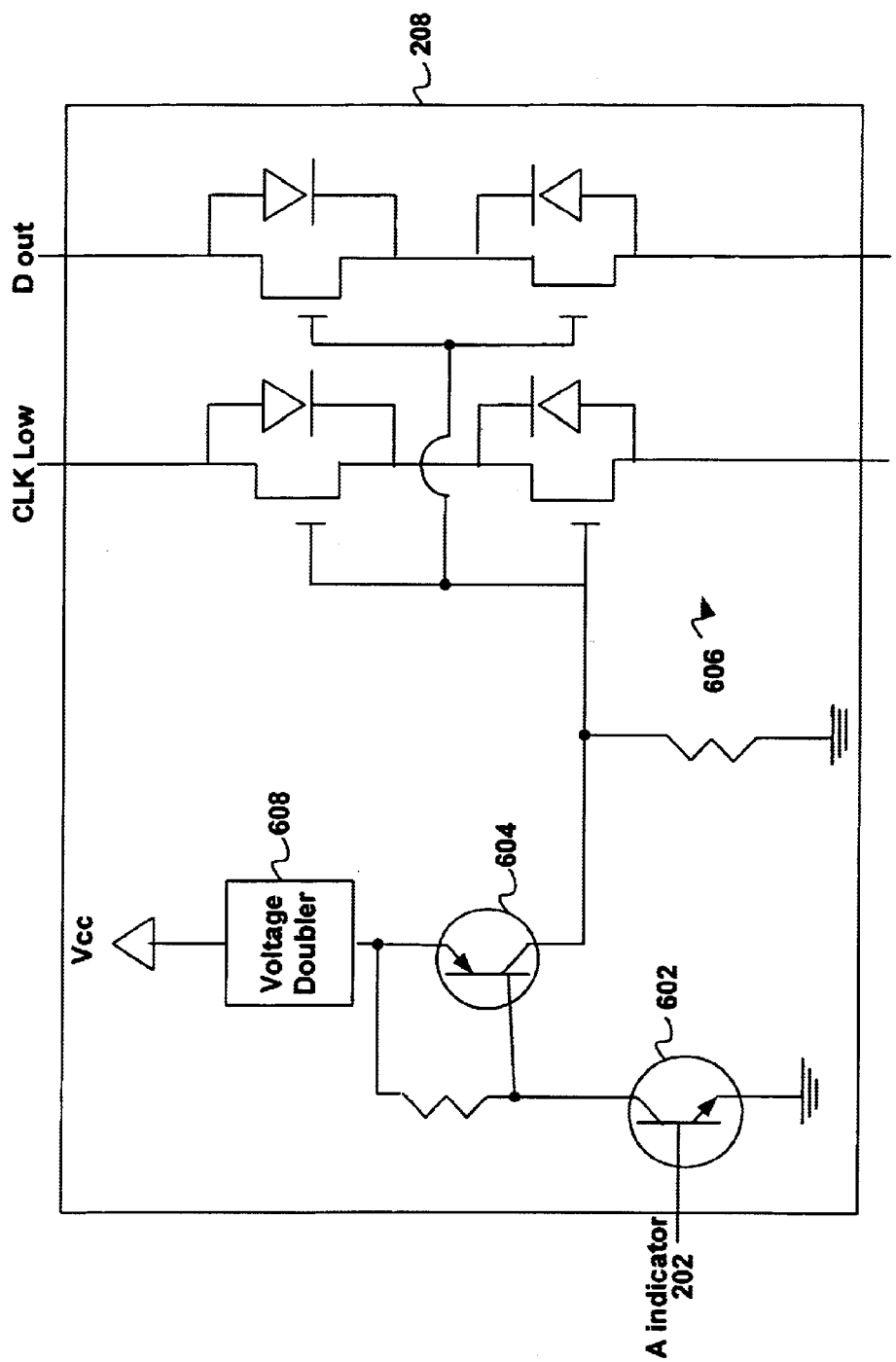
FIGS. 6A & 6B are circuit diagrams showing various portions of the protection circuitry residing on the processor in greater detail.

FIG. 6A shows the data transfer control circuit 208 on the processor 10 in greater detail. An N-P-N transistor 602 is connected in series with a P-N-P transistor 604. The emitter of transistor 604 is connected to a voltage doubler 608, which in turn is connected to Vcc. The collector of transistor 604 is connected to the gate terminals of two FET pairs 606. These two FET pairs control the transmission of two signals transmitted through the multi-wired cable 16b, namely DOUT and CLK LOW.

When the A-indicator signal 202 is not asserted (i.e., is high), transistor 602 will have bias current applied to it. This switches on transistor 602, which consequently switches on transistor 604. Because transistor 604 is switched on, gate voltage is applied to the FET isolation transistors 606. Asia result, the FET isolation transistors are kept in their "ON" state, allowing both bus signals to pass through, If the window comparator 409 asserts the A-indicator signal 202 (i.e., it goes low), then transistor 602 is turned off thereby turning off transistor 604. When transistor 604 is switched off, gate voltage is removed from both N-channel FET isolation transistors 606. This turns off these FET isolation transistors and blocks the transmission of DOUT and CLK LOW through the processor to the I/O modules of the local rail.

In addition to detecting an invalid connection between the processor and adapter, the validation and protection circuitry also detects and responds to miswirings. As mentioned earlier, these include connecting two processors or two adapters together, or connecting a processor or an adapter to another PLC system that is powered down.

Connecting two processors 10 together using the multi-wired cable-16 may be detected as follows. Referring to FIG. 4, the processor 10 provides only the passive resistor R3. Without the connection to the voltage divider 410, the voltage at terminal 430, electrically connected to resistor R3, is substantially zero. So connecting two terminals 430 of two processors through interlock line 18 has no effect on the voltage thereat. Consequently, the window comparator 409 still sees an input voltage much lower than 1.4 volts, as if the processor is not connected to any other electrical component. Hence, the window comparator 409 asserts the A-indicator signal 202.

Similarly, connecting two adapters together using the cable 16 may be detected as follows. When two adapters are connected together, the resistor R3 from the processor side is not present to lower the output voltage of the voltage divider 410. The window comparator 408 on the adapter will see a voltage input higher than the upper limit of the voltage window and thus will assert the P-indicator signal 302.

As mentioned earlier, a problem would exist without the circuitry of the preferred embodiment when the processor 10 is connected to the adapter 12, but the adapter 12 is in an unpowered state. In this event the clock signals from the processor could pass through the unpowered adapter and cause the I/O modules to operate erratically. This invalid connection can be detected as follows. Referring to FIG. 4, because the adapter 12 is unpowered, the output of the voltage divider 410 at terminal 420 will be zero or very low. As the interlock line 18 electrically connects terminal 420 with terminal 430 the window comparator 409 on the processor will see the same voltage as at terminal 430, which will be much lower than 1.4 volts. This is outside the pre-specified voltage window and therefore causes the window comparator 409 on the processor 10 to assert the A-indictor signal 202.

Likewise, without the circuitry of the preferred embodiment connecting a powered adapter 12 to an unpowered processor 10 could also lead to damage as previously described. In order to detect this condition a diode D1 in the processor interlock circuit 200 is connected between resistor R3 and Vcc, as shown in FIG. 4. When terminal 430 is electrically connected to terminal 420 via the cable 16b, the diode D1 presents a path to ground (since Vcc on the processor 10 is zero volts) which bypasses the parallel connection of resistors R2 and R3. Consequently the window comparator 408 will see substantially less than 1.4 volts and assert the P-indicator signal 302.

In alternative or in addition to the foregoing, the connection of a powered adapter 12 to an unpowered processor 10 can be detected by the adapter through the reset signal 228 (FIGS. 2 & 3) which is generated by the processor when it is powered up and in normal operating condition. Referring to FIG. 3, the reset signal 228 is fed to the AND gate 304. The other input to the AND gate is the P-indicator signal 302. When the processor 10 is in an unpowered state the reset (to remote rail) signal 228 is zero volts, causing the output 306 of the AND gate 304 to go to zero. The output of 306 of the AND gate controls the date transfer control circuit 308 as previously described so as to prevent the transmission of various problematic signals to the I/O modules of the remote rail. Those skilled in the art will appreciate that while the reset signal 228 has been employed for this purpose, any other bus signal which is normally high (i.e., non-zero volts) when the processor is powered on may be used to the same effect.

Figure 6B:
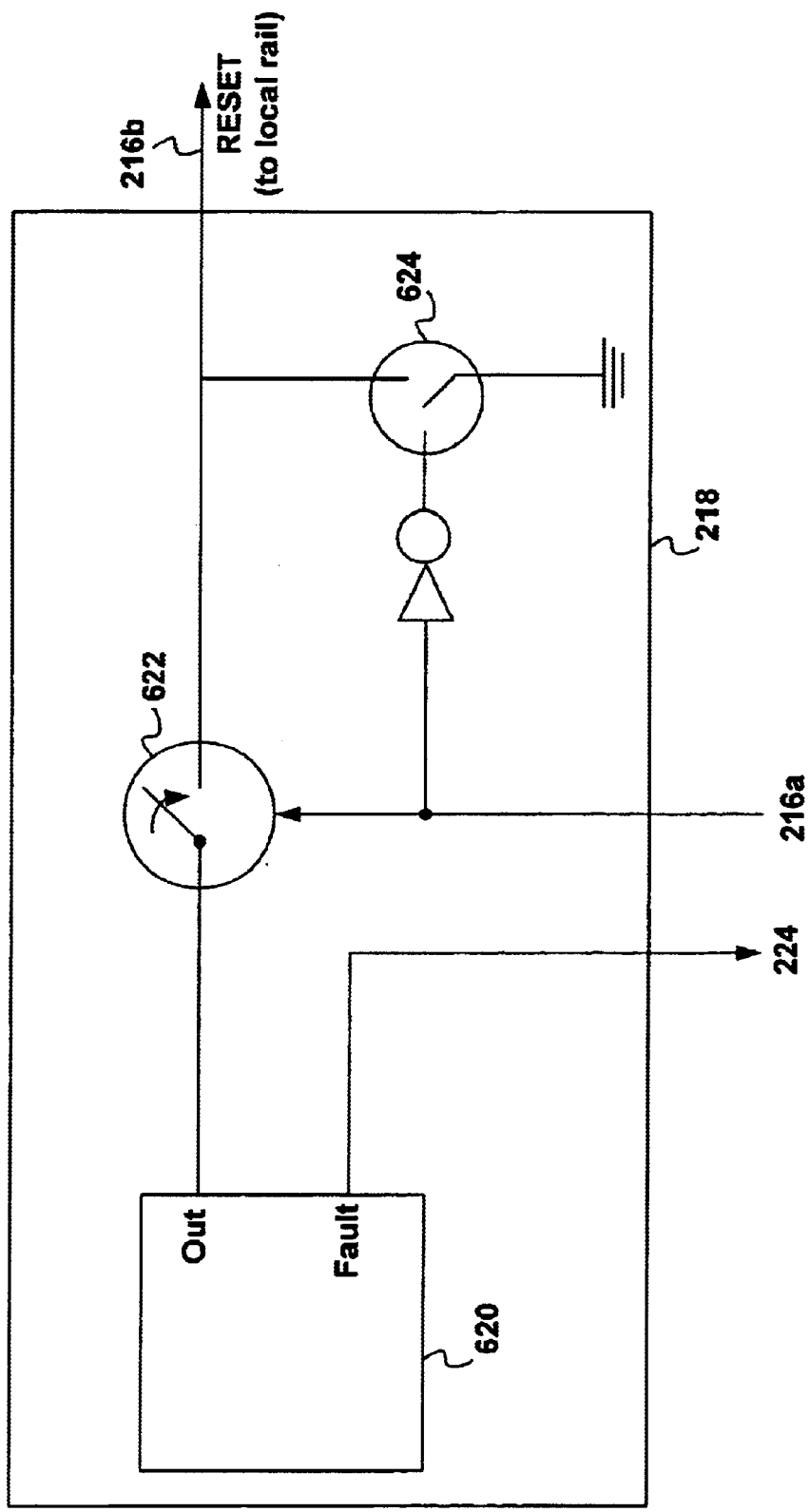

In addition to the foregoing, the current detector 218 on the processor and the current detector 318 on the adapter determine whether the amount of current drawn on reset lines 216b or 316 exceed a pre-determined limit and generate fault signals 224 and 324 for responding to over-current conditions. Referring to FIG. 6B the current detector 218 is shown in greater detail. The detector 218 comprises a current source 620, such as part no. MAX892, available from the Maxim Integrated Circuits company. This part is able to source a current and measure the level of the output current. Once the current level exceeds a programmable limit, the part will assert the fault line 224. The output of the current source 620 is connected to a switch 622 which is controlled by the reset line 216a generated by the processor. When the processor is operating normally, the switch 622 is on or closed allowing the current source 620 to source the current for the normally high (to local rail) reset line 216b. When the fault signal 224 is asserted, the processor turns off the switch 622 by bringing line 216a to zero. As a result, switch 622 is opened and another switch 624 is closed thereby grounding the reset (to local rail) line 216b.

Figure 5B:
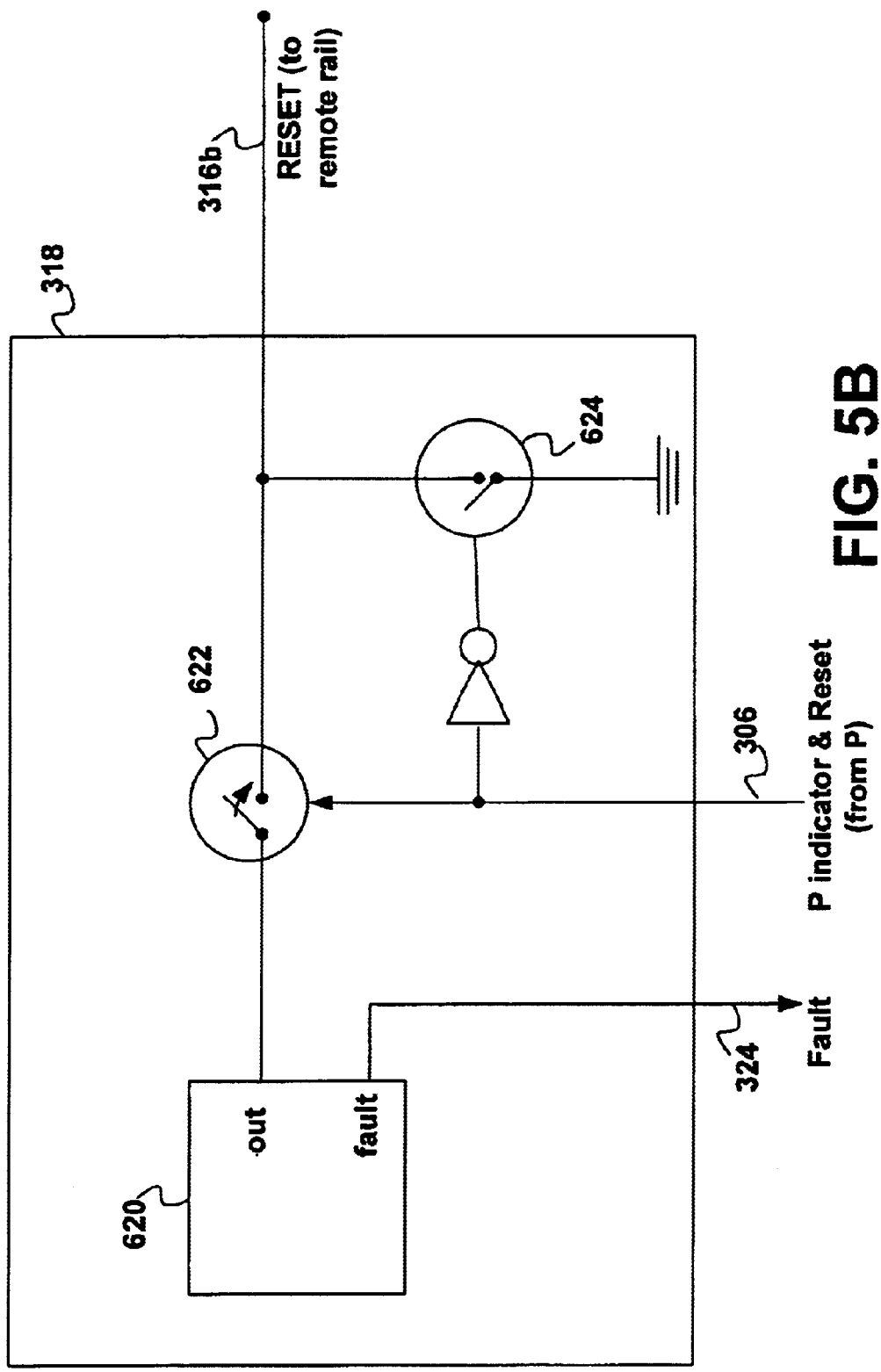

The current detector 318 on the adapter is constructed in a similar manner, as shown in FIG. 5B. On the adapter, the fault signal 324 is also an input to the interlock circuit 300. More particularly and referring to FIG. 4, the fault signal 324 is applied to the base of transistor Q1, thereby removing bias current from transistor Q1 when the fault signal 324 is asserted. This switches off transistor Q1. The connection from the positive power voltage Vcc to the voltage divider 410 is thus cut off. The voltage divider will have no input voltage and no output voltage. The window comparator 408 on the adapter therefore generates the P-indicator signal 302 in response to the detected over-current condition. Additionally, because terminal 420 and terminal 430 are connected via the interlock line 18, the window comparator 409 on the processor also does not see the input voltage from the voltage divider 410 and therefore generates the A-indicator signal 202.

Figure 7:
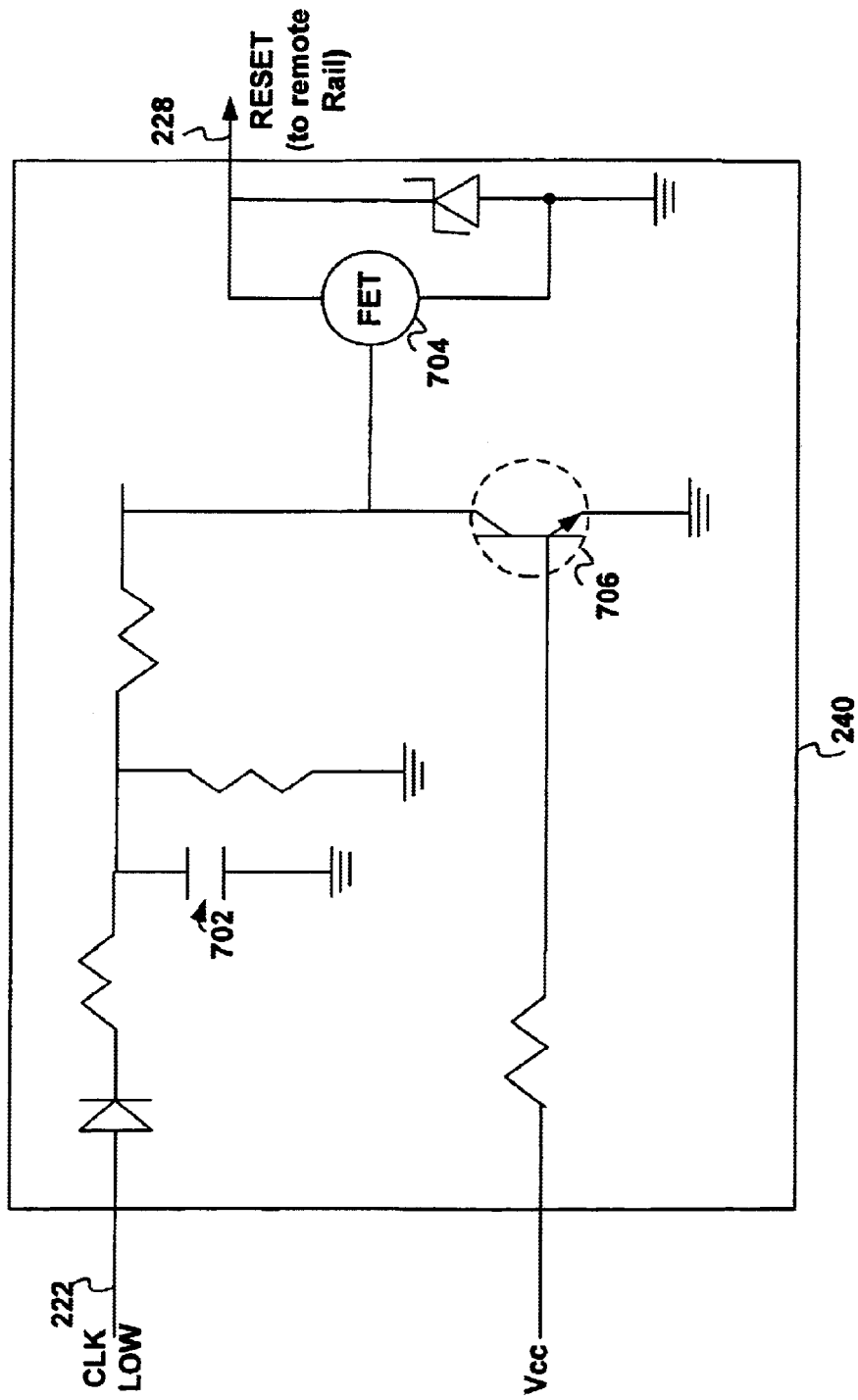
FIG. 7 is a circuit diagram showing a "sleeper" circuit residing on the processor, as described in greater detail below.
Figure 8:
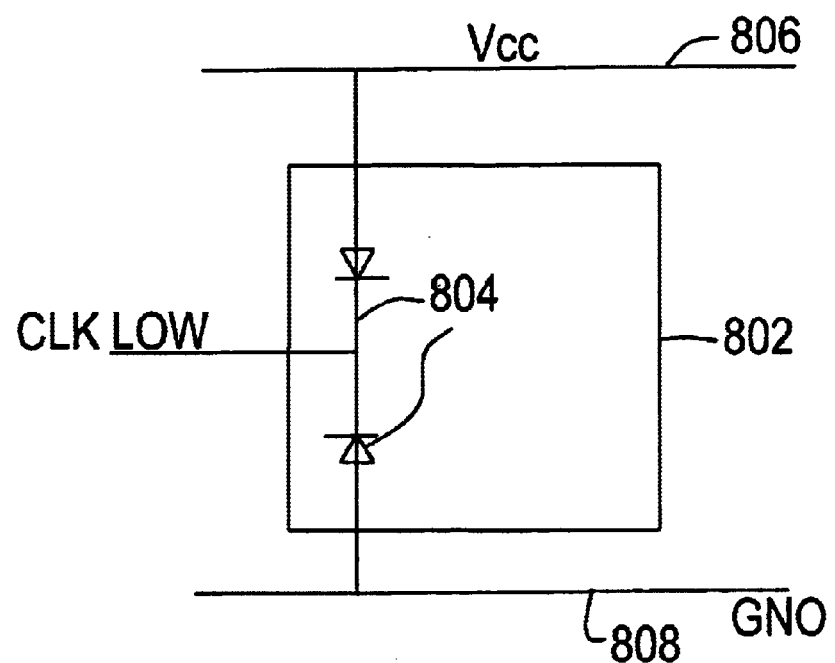
FIG. 8 is a schematic diagram showing the input clamp diodes of an I/O module.

Finally, an unpowered processor may be accidentally connected to a live second PLC system. Referring to FIG. 2, the processor includes a sleeper circuit 240 to detect this miswire and in response assert the reset signal 228 to the second system through cable 16b. Referring to FIG. 7, the sleeper circuit 240 receives the CLK line 222 from the second system and uses the energy from this clock line (or any other signal which regularly carries current) to charge up a capacitor 702. The capacitor, in turn, is connected to the gate terminal of an N-channel FET 704 that is connected between the reset line 228 and common ground. Once the capacitor 702 is sufficiently charged it will activate the FET 704. This grounds the reset line 228 leading to the live second system thereby causing the second system to reset itself. It will be quite clear that the sleeper circuit 240 should only be activated when the processor 10 is powered off as otherwise the adapter could not be connected to the processor. For this reason the sleeper circuit 240 includes a transistor 706 connected at its collector to the base of the FET 704. The base of the transistor 706 is connected to Vcc so that when the processor is powered up the transistor 706 is kept in its "on" state. This has the effect of essentially grounding the base of FET 704 and hence switching it off so that is has no effect on the reset line 228. Conversely, when the processor is powered off the transistor 706 has no effect on the sleeper circuit. If desired, the base of the transistor 706 can also be activated by other hardware or firmware to selectively control usage of the sleeper circuit.

The present invention has been described with respect to the preferred embodiments. However, it will be appreciated that various modifications and alterations might be made by those of ordinary skill in the art without departing from the spirit and scope of the invention.

What is claimed is:

1. A method of validating the connection of a multi-wired cable between first and second electrical components the method comprising:
   generating a pre-specified voltage level when the first component is properly connected to the second component through the cable and at least the first component is powered up;
   testing for the existence of the pre-specified voltage level on each of the components; and
   asserting an error signal on any component if that component does not detect the pre-specified voltage level.

2. The method according to claim 1, wherein:
   the first and second components transmit signals carried by the cable to other electrical components; and
   at least one of the first and second components inhibits the transmission of at least one such signal if the error signal on the at least one component is asserted.

3. The method according to claim 1, wherein the first component and the second component must be powered up in order to generate the pre-specified voltage level.

4. The method according to claim 1, wherein the generation of the pre-specified voltage level includes:
   applying power to a voltage divider in the first component and supplying the output of the voltage divider at a terminal of the first component;
   connecting the first component terminal with a terminal in the second component via a wire in the cable; and
   providing a circuit element connected to the second component terminal in order to modify the output of the voltage divider and yield the pre-specified voltage level.

5. The method according to claim 4, including means for short circuiting the circuit element in the second component in the event the second component is not powered up.

6. The method according to claim 4, wherein the voltage divider comprises two resistors connected in series and the circuit element is a third resistor that connects in parallel with one of the first and second resistors when the cable is properly connected between the first and second components.

7. The method according to claim 6, including a diode connected between the third resistor and a power supply in the second component for short circuiting said parallel connection of the third resistor and one of the first and second resistors in the event the second component is not powered up.

8. The method according to claim 7, wherein testing for the pre-specified voltage level includes:
   testing to determine if the voltage at the first component terminal falls within a pre-determined voltage range; and
   testing to determine if the voltage at the second component terminal falls within the pre-determined voltage range.

9. The method according to claim 4, further comprising:
   detecting on the first component the state of a pre-determined signal which is intended to be received from the second component via the cable and which is normally at a non-zero voltage level; and
   asserting the error signal on the first component if it does not detect the pre-determined signal to have a non-zero voltage level.

10. The method according to claim 9, wherein the intended signal is a normally high reset signal which is:
    unasserted when the second component is powered up and operating normally.

11. The method according to claim 9, wherein the voltage divider comprises two resistors connected in series and the circuit element is a third resistor that connects in parallel with one of the first and second resistors when the cable is properly connected between the first and second components.

12. The method according to claim 9, wherein:
    the first and second components transmit signals carried by the cable to other components; and
    at least one of the first and second components inhibits the transmission of at least, one such signal if the error signal on the at least one component is asserted.

13. The method according to claim 9, wherein each component detects the amount of current flowing in the reset signal and asserts the corresponding error signal when said current flow exceeds a pre-specified value.

14. The method according to claim 9, wherein the components are elements of a programmable logic control system, the second component being a processing module and the first component being an adapter.

15. Apparatus for confirming that a multi-wired cable is validly connected between first and second electrical components, the apparatus comprising:
    a voltage divider connected to a power supply in the first component, wherein the voltage divider comprises two resistors connected in series and having a common node thereof connected to a terminal of the first component;
    a third resistor in the second component connected to a terminal thereof so as to be disposed in parallel with one of the two resistors and yield a pre-specified voltage at the output of the voltage divider when the cable is properly connected between the first and second components;
    circuitry connected to the first component terminal in order to test for the presence of the pre-specified voltage and assert an error signal in the absence thereof; and circuitry connected to the second component terminal in order to test for the presence of the pre-specified voltage and assert an error signal in the absence thereof.

16. The apparatus according to claim 15, including a diode connected between the third resistor and a power supply in the second component for short circuiting said parallel connection of the third resistor and one of the first and second resistors in the event the second component is not powered up.

17. The apparatus according to claim 16, wherein the testing circuitry on each electrical component comprises a window comparator for determining if the voltage at the corresponding terminal falls within a pre-determined voltage range.

18. The apparatus according to claim 15, further comprising circuitry for detecting on the first component the state of a reset signal which is intended to be received from the second component via the cable and for asserting the error signal on the first component if the reset signal is not in a non-zero unasserted state.

19. The apparatus according to claim 1, wherein the first and second components transmit signals carried by the cable to other electrical components, and including circuitry for enabling at least one of the first and second components to inhibit the transmission of at least one such signal in the event the error signal on the at least one of the first and second components is asserted.

20. The apparatus according to claim 19, wherein each component detects the amount of current flowing in the reset signal and asserts the error signal associated with the component when said current flow exceeds a pre-specified value.

21. A programmable logic control (PLC) system comprising:
a processor having a built-in power supply;
a local group of I/O modules;
a system bus for enabling the processor to communicate with the local group of I/O modules, the local group receiving power from the processor via a dedicated line on the system bus;
an adapter having a built-in power supply;
a first cable for extending the system bus from the processor to the adapter, wherein the dedicated line is used to electrically connect a terminal on the processor with a terminal on the adapter;
a remote group of I/O modules communicating with the adapter via the system bus, the remote group receiving power from the adapter via the dedicated line on the system bus;
a voltage divider connected to the power supply of one of the pair of the processor and the adapter, the voltage divider comprising two resistors connected in series and having a common node thereof connected to the terminal of the one of said pair;
a third resistor disposed in the other of said pair and connected to a terminal thereof so as to be disposed in parallel with one of the two resistors and yield a pre-specified voltage at the output of the voltage divider when the terminals of the processor and adapter are connected;
circuitry disposed on the one of said pair for detecting the pre-specified voltage and for asserting an error signal in the absence thereof; and
circuitry disposed on the other of said pair for detecting the pre-specified voltage and for asserting an error signal in the absence thereof.

22. The PLC system according to claim 21, wherein a second cable, identical to the first cable, is used to split the local group or the remote group of I/O modules.

23. The PLC system according to claim 21, wherein the testing circuitry includes a window comparator for determining if the voltage at the corresponding terminal falls within a pre-determined voltage range.

24. The PLC system according to claim 21, including a diode connected between the third resistor and a power supply in the other of said pair for short circuiting said parallel connection of the third resistor and one of the first and second resistors in the event the other of said electrical component pair is not powered up.

25. The PLC system according to claim 21, wherein the one of said pair is the adapter and the other of said pair is the processor, and further comprising circuitry for detecting on the adapter the state of a reset signal which is intended to be received from the processor via the first cable and for asserting the error signal on the adapter if the reset signal is not in a non-zero unasserted state.

26. The PLC system according to claim 25, including circuitry for enabling at least one of the processor and the adapter to inhibit the transmission of pre-specified bus signals in the event the error signal on the at least one of the processor and the adapter is asserted.

27. The PLC system according to claim 21, wherein the processor and the adapter each detect the amount of current flowing in the reset signal and assert the corresponding error signal in the event the current flow exceeds a pre-specified value.

* * * * *